(12) United States Patent
Tutsch et al.

(10) Patent No.: US 6,630,727 B1
(45) Date of Patent: Oct. 7, 2003

(54) MODULARLY EXPANDABLE MULTI-LAYERED SEMICONDUCTOR COMPONENT

(75) Inventors: Günter Tutsch, Saal (DE); Thomas Münch, Laaber (DE)

(73) Assignee: Infineon Technologies AG, Müenchen (DE)

( * ) Notice: Subject to any disclaimer, the term of this patent is extended or adjusted under 35 U.S.C. 154(b) by 129 days.

(21) Appl. No.: 09/655,603

(22) Filed: Sep. 5, 2000

Related U.S. Application Data (63) Continuation of application No. PCT/DE99/00496, filed on Feb. 24, 1999.

(30) Foreign Application Priority Data

Mar. 3, 1998 (DE) .......................................... 198 08 986

(51) Int. Cl.[7] ....................... H01L 25/065; H01L 23/06; H01L 23/48; H01L 21/18
(52) U.S. Cl. ........................ 257/668; 257/698; 257/700; 257/701; 257/758; 257/704; 257/706; 257/710; 257/712; 257/729; 257/794; 257/789; 257/691; 257/207; 257/208; 257/694; 361/735; 361/744; 361/790
(58) Field of Search ....................... 257/668, 685, 257/686, 773, 700, 701, 758, 784, 690, 692, 704, 706, 710, 712, 729, 794, 789, 207, 208, 694; 361/735, 744, 790

(56) References Cited

U.S. PATENT DOCUMENTS

| | | | |
|---|---|---|---|
| 4,410,927 A | * 10/1983 | Butt | 361/720 |
| 4,826,297 A | * 5/1989 | Kubo et al. | 349/151 |
| 5,040,994 A | * 8/1991 | Nakamoto et al. | 439/76.1 |
| 5,134,546 A | * 7/1992 | Izumi et al. | 361/736 |
| 5,434,745 A | 7/1995 | Shokrgozar et al. | |
| 5,981,043 A | * 11/1999 | Murakami et al. | 428/209 |
| 6,380,616 B1 | * 4/2002 | Tutsch et al. | 257/686 |
| 6,445,254 B1 | * 9/2002 | Shibuya et al. | 331/68 |
| 6,545,368 B2 | * 4/2003 | Wensel | 257/787 |
| 2002/0027763 A1 | * 3/2002 | Schaper | 361/306.2 |
| 2003/0071348 A1 | * 4/2003 | Eguchi et al. | 257/723 |

FOREIGN PATENT DOCUMENTS

DE 38 38 085 A1 5/1990
EP 0 575 806 A2 12/1993

(List continued on next page.)

OTHER PUBLICATIONS

Minehan, W.T. et al.: "Fabrication, Assembly, And Characterization Of Stacked Multichip Modules Using Hot Pressed, Co–Fired Aluminum Nitride", The International Journal of Microcircuits and Electronic Packaging, vol. 17, No. 4, Fourth Quarter 1994, pp. 369–375.

(List continued on next page.)

Primary Examiner—Alexander O. Williams
(74) Attorney, Agent, or Firm—Laurence A. Greenberg; Werner H. Stemer; Gregory L. Mayback (57) ABSTRACT

A modularly expandable semiconductor component includes at least one carrier layer, at least one intermediate layer, at least one coverlayer, at least one semiconductor chip, external contacts and a conductor configuration. The intermediate layer is provided with at least one opening, into which the at least one semiconductor chip is inserted. The carrier layer, the intermediate layer and the coverlayer are connected one above another and form a submodule. If a plurality of submodules are installed above one another, a semiconductor component is provided in which the semiconductor chips are located in several mutually overlying planes. The semiconductor chips can be interconnected. A method for producing a semiconductor component is also provided.

23 Claims, 4 Drawing Sheets

FOREIGN PATENT DOCUMENTS

| | | | | |
|---|---|---|---|---|
| JP | 57-45262 | * | 3/1982 | ......... 257/710 |
| JP | 62-145844 | * | 6/1987 | ......... 438/680 |
| JP | 2-260449 A | | 10/1990 | |
| JP | 2-303161 | * | 12/1990 | ......... 438/80 |
| JP | 5-304248 | * | 11/1993 | |
| JP | 08 148 642 A | | 6/1996 | |
| JP | 08 330 509 A | | 12/1996 | |
| JP | 10-154770 | * | 6/1998 | |
| WO | WO 88/05251 | | 7/1988 | |
| WO | WO 95/11523 | | 4/1995 | |
| WO | WO 96/31100 | | 10/1996 | |

OTHER PUBLICATIONS

Slyman, David A.: "Anisotrop leitende Kleber" [anisotropic conductive adhesive], Technische Rundschau No. 29/30, 1997, pp. 12–16.

* cited by examiner

MODULARLY EXPANDABLE MULTI-LAYERED SEMICONDUCTOR COMPONENT

CROSS-REFERENCE TO RELATED APPLICATION

This application is a continuation of copending International Application No. PCT/DE99/00496, filed Feb. 24, 1999, which designated the United States.

BACKGROUND OF THE INVENTION

Field of the Invention

The invention relates to a modularly expandable semiconductor component having at least one carrier layer, at least one intermediate layer, at least one coverlayer and at least one semiconductor chip placed on the carrier layer. The invention also relates to a method for producing a semiconductor component.

Surface-mounted electronic components, also referred to as SMD components, are typically embedded in a housing which is made of a plastic molding compound, with electrical terminals being led out therefrom. There are a number of different housing construction types, which vary in size and which include a varying number of terminals. A semiconductor chip is first connected therein to a carrier layer. The connecting of the semiconductor chip to the carrier layer is usually accomplished by adhesion, soldering, or alloying. Following the securing of the semiconductor chip, its individual terminal points are connected to terminals of the carrier frame, for instance by using bonding wires. Next, the semiconductor chip and the terminals of the terminal frame are coated in such a way that the semiconductor chip is fully encapsulated and the terminals protrude from the housing.

It is necessary to construct the semiconductor component with optimally small dimensions. Given an optimally small volume, an optimally high storage density, that is to say performance of the semiconductor component, should be realized. If a reduction of housing space consumption is desired, given peripheral external pinning, that can only be done by refining a terminal grid significantly. However, with such a miniaturization of external pinning, one would move closer and closer to the limits of processing capability both in production and in soldering onto the assembly carrier. That necessitates completely new technologies of construction, such as the multichip module (MCM).

In a multichip module, a plurality of semiconductor chips are installed on a substrate adjacent one another in one plane and connected thereto. That permits the realization of internal chip-to-chip connections. Besides plastic leadframe packages, in which the semiconductor chips are installed on a substrate layer and which are coated by a surrounding plastic injection compound following electrical contacting, there are also ceramic packages in existence which have a cavity into which the semiconductor chips are inserted. Three principles of construction can be distinguished:

In a first embodiment, a multilayer wiring system (substrate) is integrated into a housing. That principle is applied primarily in plastic leadframe packages. In a second type of production, the housing already includes a wiring carrier system (cofired ceramic and laminate packages). In a third form, the simplest, the housing includes a construction without a wiring carrier system. It is thus possible to produce a direct interconnection through a wire connection with simple multichip modules having two or maximally three semiconductor chips.

Besides the complicated production of the substrate, as it is known, the primary disadvantage of the multichip modules is that they are unsuitable for economical mass production.

SUMMARY OF THE INVENTION

It is accordingly an object of the invention to provide a modularly expandable semiconductor component and a method for producing a semiconductor component, which overcome the hereinafore-mentioned disadvantages of the heretofore-known devices and methods of this general type, in which a high packing density is achieved given a low volume consumption and in which a high reliability is guaranteed, while simultaneously keeping production costs low.

With the foregoing and other objects in view there is provided, in accordance with the invention, a modularly expandable semiconductor component, comprising at least one carrier layer, at least one intermediate layer and at least one coverlayer respectively disposed above one another; external contacts; a conductor configuration disposed on the at least one carrier layer and leading to the external contacts; and at least one semiconductor chip inserted in the at least one intermediate layer and having contact pads connected to the conductor configuration; the at least one carrier layer and the at least one intermediate layer formed of an at least partly oxidized-through aluminum foil material having a metallic core.

The basic concept of the invention resides in accommodating a plurality of semiconductor chips in one semiconductor component, but with the semiconductor chips being disposed not merely in one plane but rather wherein they may also be installed over one another in several planes. The semiconductor component thus is respectively formed of at least one carrier layer, one intermediate layer, one coverlayer, at least one semiconductor chip with contact pads on a top side, external contacts and an interconnect configuration. The interconnects produce the electrical connection between the contact pads of the semiconductor chip and the external contacts.

In accordance with another feature of the invention, the intermediate layer has at least one opening. This at least one opening serves for accepting the at least one respective semiconductor chip. The printed conductor configuration is located on the carrier layer. The intermediate layer, the carrier layer and the coverlayer are connected to one another in such a way that they lie one over the other. The component is further constructed in such a way that the printed conductors of the carrier layer terminate on one hand in a region near the semiconductor chip, and on the other hand in an edge region of the semiconductor component.

An advantage of this type of component construction is that the semiconductor component can be manufactured with known production methods and materials. The carrier layer is formed of an aluminum foil that has been completely or partly oxidized through, and on the top side of which conductors are etched or printed. The production methods of printed circuit boards (PCB) can be used for this purpose. Like the carrier layer, the intermediate layer also is formed of aluminum foil that has been completely or partly oxidized through. Aluminum foil that has been oxidized through at least partly has the advantage of ensuring that the coefficients of thermal expansion are better suited to the values of semiconductor chips and plastic molding compound. Furthermore, aluminum foil undertakes an insulation of the individual layers from one another. If a metallic aluminum core remains in aluminum foil that has been partly oxidized through, then this core assumes an electrical shielding of the respective intermediate layers or carrier layers that are located over one another. An inclusion of moisture is also prevented. A further advantage is a more cost-effective production of aluminum foil as compared to the use of FR4, a common substrate. Openings are stamped or embossed into the intermediate layer and it is also possible to use any other known method of production. This production step is also known.

In accordance with a further feature of the invention, the coverlayer is formed of a material which dissipates heat well and which is well suited to the values of the carrier layer and the intermediate layer regarding coefficients of thermal expansion.

In accordance with an added feature of the invention, the semiconductor component is composed of what are known as submodules. A submodule is formed of a carrier layer, onto which an intermediate layer has been laminated on both sides, as well as one or two respective coverlayers. The coverlayer or coverlayers are applied on the other side of the intermediate layers and form a termination of the semiconductor component. This means that one side of an intermediate layer has the coverlayer and the other side of an intermediate layer has the carrier layer. Since both the coverlayer and the carrier layer have a planar surface, a plurality of these submodules in one-sided or double-sided embodiments can be combined into one semiconductor component. The one-sided submodule is formed of a carrier layer and an intermediate layer applied on one side and covered in turn by a coverlayer. A double-sided submodule is constructed in such a way that the carrier layer is provided with an intermediate layer on both sides, with the still-exposed side of the two intermediate layers being covered by a respective coverlayer.

Since each intermediate layer has an opening in which at least one semiconductor chip is respectively inserted, joining several submodules above one another achieves a stack of semiconductor chips in the third dimension. A high packing density of the semiconductor component is thereby achieved given a low volume requirement.

In accordance with an additional feature of the invention, the ends of the printed conductors, which are situated in the vicinity of the at least one semiconductor chip, are positioned on the carrier layer in such a way that the ends of the printed conductors become situated inside the opening or openings located in the intermediate layer.

In accordance with yet another feature of the invention, in a double-sided submodule, the printed conductors are placed on both sides of the carrier layer. However, it is also conceivable for the printed conductor configuration to be placed on both sides of the carrier layer in a one-sided submodule. This imparts the advantage of permitting the guiding of the printed conductors to be accomplished with greater flexibility.

A further advantage of the semiconductor component according to the invention is that the carrier layer is constructed similarly to a PCB. This makes it possible to integrate housed as well as unhoused semiconductor chips in the semiconductor component. The semiconductor chips can be applied to the carrier layer through the use of a flip-chip process and can also be glued or laminated onto the carrier layer with their unstructured back sides and electrically connected to the printed conductors by a wire-bonding process or a spider strip. The semiconductor chips that sit in the openings can be surrounded by a plastic molding compound subsequent to the electrical contacting process or, if the reliability thereof is guaranteed, they can also sit in the opening without the molding compound.

In accordance with yet a further feature of the invention, there is provided at least one passive component integrated on the carrier layer. The passive components can be electrical resistors, capacitors, or the like, for example.

In accordance with yet an added feature of the invention, the coverlayer advantageously extends beyond the intermediate layer and the carrier layer on a side at which there are no external contacts disposed. In this case, the coverlayer is constructed as a heat distributor. The heat distributor that projects beyond the intermediate layer and the carrier layer can be optimized to the heat loss of the semiconductor component that must be dissipated. The greatest thermal power loss can be dissipated when the coverlayer extends beyond the intermediate layer and the carrier layer on all sides at which external contacts are not disposed.

In accordance with yet an additional feature of the invention, the carrier layer extends beyond the intermediate layer and the coverlayer on the side at which the external contacts of the semiconductor component are disposed. The external contacts can thus be constructed as plug connections. When the printed conductors are led to the end of the carrier layer, subsequent to the application of metallizations at the ends of the printed conductors, a plug connection can be produced which is electrically contacted to a subassembly, module or board carrier. However, it is by all means also conceivable to construct the external contacts as pins.

In accordance with again another feature of.the invention, when the metallization contacts of the plug connection are attached to the carrier layer on both sides in an opposing manner, it is conceivable that the two metallizations conduct the same electrical signal or that each of the two metallizations conducts a separate electrical signal. This is advantageous above all when the printed conductors are attached to the carrier layer on both sides.

In accordance with again a further feature of the invention, in order to ensure a correct attachment of the semiconductor component on a subassembly carrier, the carrier layer includes a mechanical coding, for instance in the form of a recess or a polygonal cutout on a corner side. The mechanical coding can assume any conceivable form, as long as it is guaranteed that an incorrect contacting on the subassembly carrier is prevented.

In accordance with again an added feature of the invention, in order to keep the number of external contacts optimally low, and thus to simplify the installation and the course of the printed conductor configuration, it is advantageous that all semiconductor chips that are located in the semiconductor component are supplied through a common printed conductor. This means that, given n semiconductor chips, (n-1)*2 external contacts can be spared. Printed conductors within the semiconductor component provide for the electrical connection of the contact pads of the semiconductor chip, which serve, along with the respective external contacts, for supply.

Semiconductor chips of different types can be contained in the semiconductor component according to the invention. For example, these can be memory chips and/or processors. The semiconductor chips can be connected to one another through printed conductors as long as the semiconductor chips lie in one plane.

In accordance with again an additional feature of the invention, with the aid of through-platings which are located in the carrier layer or the intermediate layers, it is possible to electrically interconnect semiconductor chips that are located in different planes.

In accordance with still another feature of the invention, if semiconductor chips that are located in different submodules are to be connected, then the coverlayer and the carrier layer include what are known as contact interfaces. The contact interfaces are attached in such a way that they overlay each other precisely when the carrier layer of one submodule is connected to the coverlayer of another submodule. If the connection of the two submodules is carried out by using an anisotropic glue or adhesive, the electrical connection of the contact interfaces of the two intermediate layers is simultaneously ensured. It is also possible to use soldering pastes or solder balls for the electrical connection, whereby the connection of two submodules can then be produced through the use of adhesion or lamination. An anisotropic conductive glue or adhesive has the advantageous characteristic that it is conductive in direction y, for example, while at the same time being electrically insulating in direction x. At the same time, it undertakes the secure mechanical connection between a carrier layer and a coverlayer. The contact interfaces are electrically connected to a through-plating, which in turn is electrically conductively connected to a printed conductor on a carrier layer.

The advantage of the semiconductor component according to the invention resides in the ability to accommodate in one submodule groups which belong together functionally.

Semiconductor chips of different types can be combined in one submodule, for instance memory chips with processors. Furthermore, it is possible to integrate passive components in one submodule. Since the two sides of a submodule, that is a cover layer and a carrier layer in a one-sided submodule and two coverlayers in a double-sided submodule, are planar, a plurality of submodules can be placed over one another, connected, and combined into a very compact semiconductor component. Due to the compact configuration of the respective individual semiconductor chips in one or more submodules, or of the passive components, a very good signal performance is guaranteed, above all at higher frequencies, based on the short signal lengths. Furthermore, it is possible to electrically connect semiconductor chips in one submodule to one another, as well as to connect semiconductor chips in different submodules to one another through contact interfaces. In a double-sided submodule, very short signal paths can be created between two semiconductor chips when they are attached to the carrier layer in a mirrored manner, and when the electrical contacts are connected to one another through the use of through-platings through the carrier layer. Furthermore, a good heat dissipation is guaranteed by the integrated coverlayers, which are applied on every intermediate layer. By virtue of the placement of a plurality of submodules over one another, a smaller deformation of the completely equipped and sealed semiconductor component is guaranteed. A cost-effective production of the semiconductor component is possible, since known production technologies and manufacturing tools can be used. A flexible combination of different functional subassemblies is possible on the basis of the modular construction of the submodules.

With the objects of the invention in view, there is also provided a method for producing a semiconductor component formed of one submodule. In a first step, a carrier layer is equipped with a printed conductor configuration and, if so desired, with passive components. Next, the carrier layer is connected to an intermediate layer, which has at least one opening. The connection is advantageously accomplished by lamination. At least one semiconductor chip is inserted into the opening of the intermediate layer and this chip is connected to the carrier layer. The semiconductor chip can be placed on with its structured side on the carrier layer (face down) or with its rear side thereon. Next, the semiconductor chip is electrically contacted to the printed conductors. The ends of the printed conductors are installed on the carrier layer in such a way that they project into the opening of the intermediate layer. Following the electrical contacting process, the opening can be filled with a plastic molding compound, but need not be. In a last step, a coverlayer is applied to the intermediate layer, thereby covering the at least one opening of the intermediate layer. The coverlayer is connected to the intermediate layer securely, for instance by lamination. In a final step, metallizations are applied to the ends of the printed conductors, which are located on the carrier layer that projects beyond the coverlayer and the intermediate layer on the side at which the external contacts are provided.

If a double-sided submodule is to be produced, an intermediate layer having at least one opening is applied on the second side of the carrier layer, and at least one semiconductor chip is inserted in the opening and electrically connected to the printed conductors in turn. Next, a coverlayer is applied to the second intermediate layer. The coverlayer advantageously projects beyond the carrier layer and the two intermediate layers on all sides at which external contacts of the semiconductor component are not accommodated. The metallizations on the carrier layer, which form the external contacts, can be attached to the carrier layer on one or both sides.

With the objects of the invention in view, there is additionally provided a second method of production which differs from the method just described in that the semiconductor chips are first placed on the carrier layer having the printed conductors and the passive components, and are securely connected. Next, the contact pads of the semiconductor chips are connected to the printed conductors of the intermediate layers, for instance with the aid of bonding wires. The semiconductor chips can be placed onto the carrier layer on one or both sides. Only then is an intermediate layer having openings at the locations of the semiconductor chips on the carrier layer applied to the carrier layer on one or both sides and connected thereto, for instance by lamination. The semiconductor chips situated in the openings can be sealed with molding compound. The subsequent production steps run in accordance with the first production method.

In accordance with a concomitant mode of the invention, if a plurality of submodules have been produced in accordance with one of the two described production methods, then a plurality of submodules can be connected into one semiconductor component. In this case, the base is a double-sided submodule on which one or more one-sided submodules are respectively installed. This means that the semiconductor component is always enclosed by a coverlayer on the two opposite sides. Two submodules are always joined in such a way that a coverlayer is connected to an intermediate layer.

Other features which are considered as characteristic for the invention are set forth in the appended claims.

Although the invention is illustrated and described herein as embodied in a modularly expandable semiconductor component and a method for producing a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
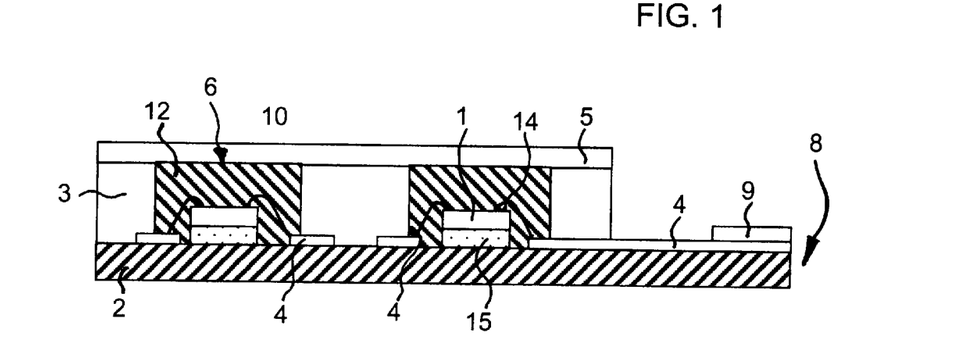
FIGS. 1–3 are diagrammatic, cross-sectional views of a semiconductor component formed of a one-sided submodule.

Referring now to the figures of the drawings in detail and first, particularly, to FIG. 1 thereof, there is seen a semiconductor component formed of a one-sided submodule. A carrier layer 2 has printed conductors or conductor tracks 4 on one side. An intermediate layer 3 which includes openings 6 is laminated onto a side on which the printed conductors 4 are installed. The intermediate layer 3 is covered by a coverlayer 5. Semiconductor chips 1 are inserted into the openings 6 and connected to the carrier layer 2 with the aid of an adhesive or glue 15. As is represented in the drawing, the semiconductor chips 1 have a non-conductive rear side which is glued onto the carrier layer 2. However, fixing techniques other than adhesion are also conceivable. Contact pads 14 that are located on the semiconductor chips 1 are electrically connected to the printed conductors 4 with the aid of bonding wires 10. The openings 6 are sealed by using a plastic molding compound 12. A coverlayer 5 is coterminous with the intermediate layer 3 on sides at which external contacts 8 are not attached. The carrier layer 2 is extended beyond the coverlayer 5 and the intermediate layer 3 on the side at which the external contacts 8 are attached, and the printed conductors 4 extend to the end of the carrier layer 2. Metallizations 9 are applied to the ends of the printed conductors 4. These metallizations represent the external contacts 8 in the form of plug connections. The semiconductor chips 1 that are shown in the figure can be electrically connected to one another with the aid of the printed conductors 4, but need not be. Ends of the printed conductors 4 that are situated in the vicinity of the semiconductor chips 1 lie within the respective openings 6. An aluminum foil which has a metallic core and which has been oxidized through at least partly, is used as the material of the intermediate layer 3 and the carrier layer 2.

Figure 2:
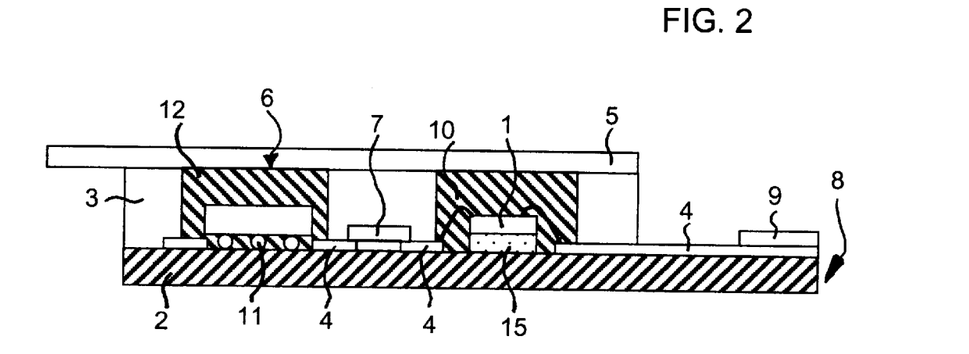

FIG. 2 shows a semiconductor component formed of a one-sided submodule. FIG. 2 differs from FIG. 1 in that the coverlayer 5 is extended beyond the intermediate layer 3 at least on the side opposite the external contacts 8, in order to achieve a greater heat distribution. Furthermore, passive components 7 are installed on the carrier layer 2, on which the printed conductors 4 have been printed or etched, for example. FIG. 2 shows two openings 6 in the one intermediate layer 3, with a semiconductor chip 1 located in each opening. One of the semiconductor chips 1 is secured on the carrier layer 2 through the use of flip-chip contacting 11 and is electrically connected to the printed conductors 4. The other semiconductor chip 1 is glued onto the carrier layer 2 with its rear side and is electrically connected to the printed conductors with the aid of bonding wires 10. The two openings 6 are filled with plastic molding compound 12 in order to ensure the reliability of the semiconductor component, for instance by preventing moisture permeating into the openings 6. It is by all means conceivable for the intermediate layer 3 to include more than two openings 6, and for a plurality of semiconductor chips 1 to be accommodated in one opening 6.

Figure 3:
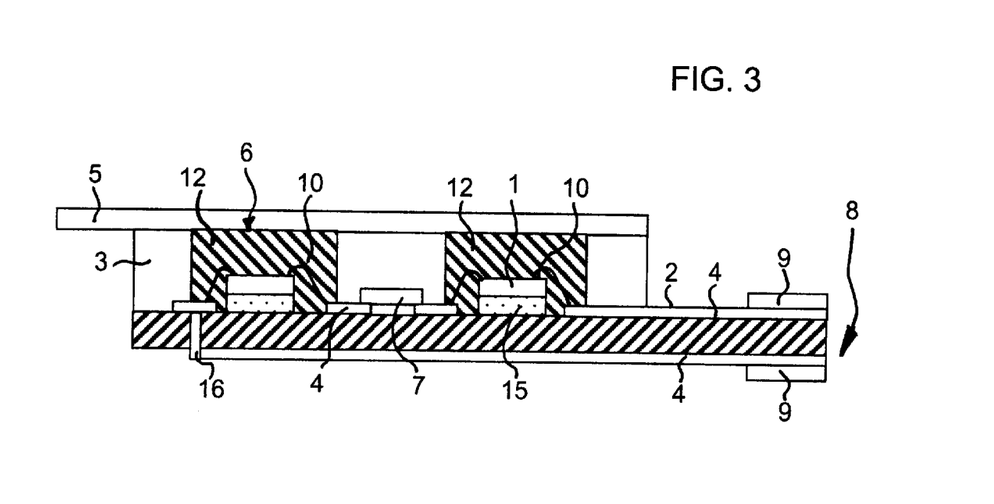

FIG. 3 shows a semiconductor component formed of a one-sided submodule. The carrier layer 2 includes printed conductors 4 on both sides. An intermediate layer 3, which includes openings 6, is applied on one side of the carrier layer 2. A respective semiconductor chip 1 is situated in each of the openings 6 and is secured with its non-conductive rear side on the intermediate layer 2 through the use of adhesive or glue 15. The semiconductor chips 1 are electrically connected to the printed conductors 4 with the aid of bonding wires 10. On the side at which the intermediate layer 3 is affixed to the carrier layer 2, the carrier layer 2 includes passive components 7, which can be resistors or capacitors, for example. The coverlayer 5 projects beyond the intermediate layer 3 and the carrier layer 2 at least on the side at which external contacts 8 are not attached, in order to achieve a greater heat dissipation. Printed conductors 4 which are located on the bottom side of the carrier layer 2 are connected to the printed conductors 4 on the top side of the carrier layer 2 with the aid of through-platings 16 passing through the carrier layer 2. The advantage of running the printed conductors on both sides is that it is possible to apply a metallization 9 on both sides of the external contacts 8, thereby providing greater flexibility in the guiding of the printed conductors. This creates the advantage of permitting twice the number of outer external contacts to be created without having to reduce the spacing between two printed conductors 4 or two metallizations 9.

Figure 4:
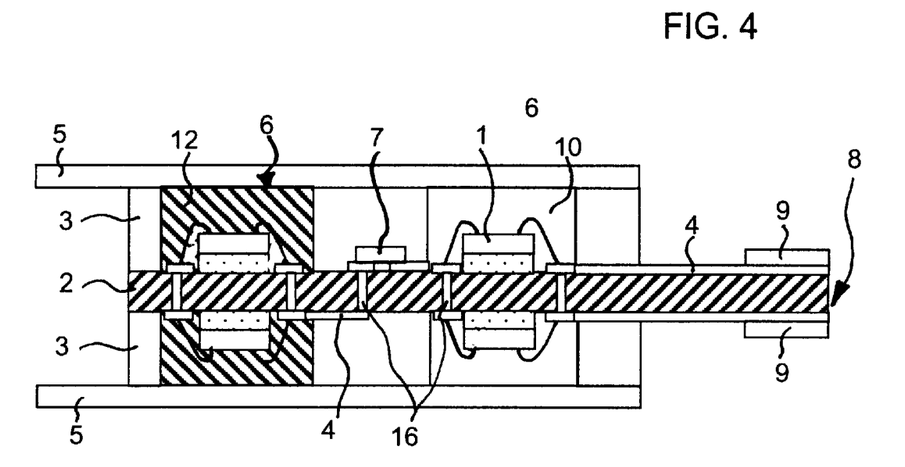
FIGS. 4 and 5 are cross-sectional views of a semiconductor component formed of a double-sided submodule.

FIG. 4 shows a cross-section of a semiconductor component formed of a double-sided submodule. Printed conductors 4 and passive components 7 (only visible on one side) have been installed on the carrier layer 2 on both sides. At least one semiconductor chip 1 has been inserted into each of the openings 6 and connected to the carrier layer 2. In the drawing, all of the semiconductor chips 1 are secured on the carrier layer 2 with their non-conductive rear side through the use of adhesive or glue 15. The electrical contacting of all of the semiconductor chips 1 is carried out through the use of bonding wires 10 from the contact pads 14 of the semiconductor chips 1 to the printed conductors 4. On each of the two intermediate layers 3, a coverlayer 5 has been applied, which covers the intermediate layer 3 with the openings 6. On the sides at which external contacts 8 are not attached to the semiconductor element, the coverlayers 5 project beyond the intermediate layers 3 and the carrier layer 2. The semiconductor chips 1 that are not situated in the same intermediate layer 3 can be connected to one another through the use of through-platings 16. However, the through-platings 16 can also serve only to optimize the printed conductor guidance. It is not absolutely essential that every through-plating produce a chip-to-chip connection. In the figure there is only one passive component illustrated on the carrier layer 2. However, it is of course possible for passive components to be placed on at both sides of the carrier layer 2. The external contacts 8 are constructed as plug connections as in the previous drawings. In other words, the ends of the printed conductors 4 include metallizations 9, through which a subassembly carrier can be contacted. Two of the four openings 6 in the drawing are filled with molding compound 12. In the other two openings 6 the semiconductor chips 1 sit without any direct protection surrounding them. As long as it is ensured that the reliability of the semiconductor component is not compromised, for instance by ingressive moisture, the opening 6 need not be filled with the molding compound 12.

It is common to all of the illustrated exemplary embodiments that they are formed of a carrier layer, at least one intermediate layer, and at least one coverlayer. This means that a submodule is enclosed either by two coverlayers or by a cover layer and the carrier layer. The semiconductor components have an absolutely planar surface, so that a plurality of the illustrated submodules can be connected into a larger semiconductor component. The modular construction of submodules has the advantage of permitting subunits which belong together functionally to be combined into one submodule. The functional range of a semiconductor component can be easily expanded in this way by combining several submodules. Furthermore, the thermal stress on the component is reduced by providing an integrated heat distributor in the form of the coverlayer. An optimal heat dissipation can be achieved in dependence upon the development of the heat distributor.

Figure 5:
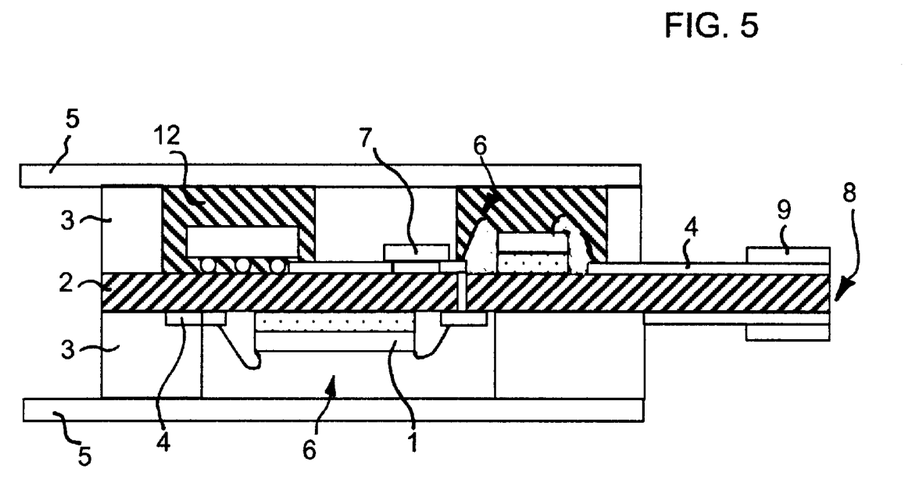

FIG. 5 shows a semiconductor component in a slightly modified form of a double-sided submodule. FIG. 5 differs from FIG. 4 only in that one of the intermediate layers 3 that have been applied to the carrier layer 2 on both sides contains only one opening 6, in which a semiconductor chip 1 can be seen in cross-section. Analogously to FIG. 4, the other intermediate layer includes two openings, with a semiconductor chip 1 being accommodated in each one. One of the two semiconductor chips 1 is electrically connected to the printed conductors 4 with the aid of flip-chip contacting 11, and the other with the aid of bonding wires 10. Additionally, in FIG. 5 a passive component 7 has been installed on only one side of the carrier layer 2. However, it is conceivable for passive components 7 to be integrated on the other side of the carrier layer 2. The semiconductor chip 1 that is situated in the bottom intermediate layer 3 is not surrounded in the opening 6 thereof by molding compound 12. The remaining features of the semiconductor component illustrated in FIG. 5 do not differ from the variants that have already been described.

Figure 6:
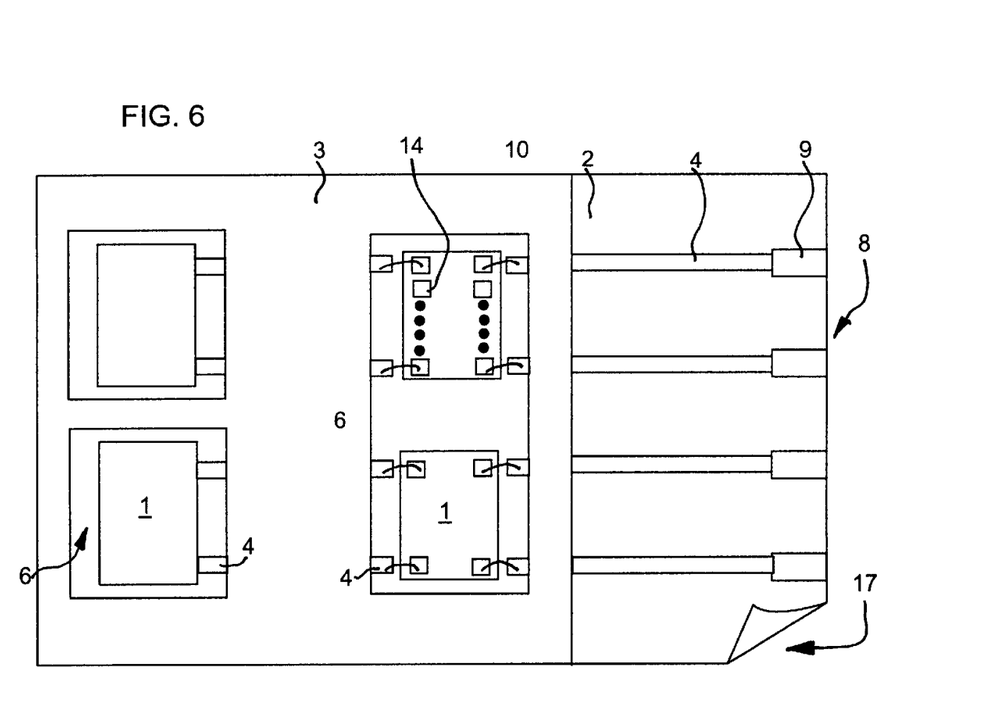
FIG. 6 is a plan view of a semiconductor component.

FIG. 6 shows a plan view of a semiconductor component. For the sake of providing a better overview, the coverlayer 5, which is applied to the intermediate layer 3 and which closes the openings 6, has been omitted. In this exemplary embodiment, the intermediate layer 3 includes three openings 6. One semiconductor chip 1 is situated in each of two openings, and two semiconductor chips 1 are situated in a large opening 6 that is located on the right side of the intermediate layer 2. The exemplary embodiment additionally shows printed conductors 4, which are installed on the intermediate layer 2 and are provided with metallizations 9, that serve as external contacts 8, at the ends of the semiconductor components. The external contacts 8 include a coding 17 in the form of an angle-shaped cut-out. The mechanical coding 17 serves to prevent an incorrect insertion of the semiconductor component on a subassembly carrier. The mechanical coding 17 can also be accomplished in the form of a recess or in the form of a polygonal cut-out or any other mechanical construction which guarantees that an incorrect contacting of the semiconductor component on a subassembly carrier is prohibited. The two semiconductor chips 1 that are situated in the large opening 6 are affixed to the carrier layer 2 with their non-conductive rear side. The contact pads 14 that are located on the semiconductor chip 1 are electrically connected to the printed conductors 4 with the aid of bonding wires 10. The ends of the printed conductors shown therein extend into the region of the opening 6. The semiconductor chips 1 that are situated in the other two openings 6 are electrically and mechanically contacted to the carrier layer 2 and the printed conductors 4 with the aid of a flip-chip process.

According to an advantageous development it is expedient that a plurality (n) of semiconductor chips 1 are supplied by common printed conductors 4. The advantage of this resides in the possibility of reducing the number of external contacts 8, or of metallizations 9, respectively, by (n−1)*2. However, this presupposes an internal interconnection of the contact pads 14 of the semiconductor chips 1 with the aid of printed conductors 4 and/or by contactings 16.

Figure 7:
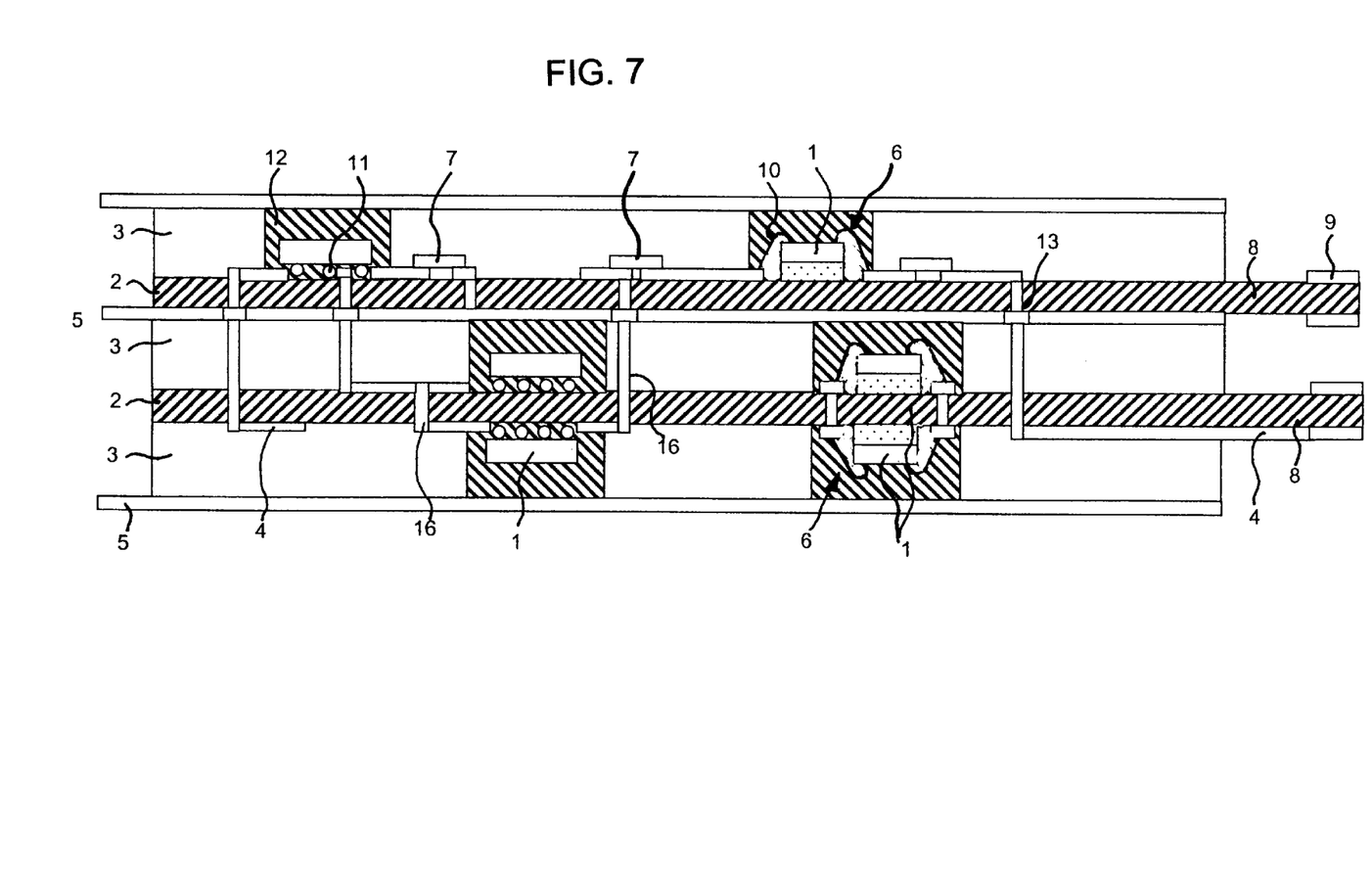
FIG. 7 is a cross-sectional view of a semiconductor component formed of respective one-sided and double-sided submodules.

FIG. 7 shows a cross-section of a semiconductor component, which is composed of two submodules. The basis of the semiconductor component according to the invention is a double-sided submodule onto which a one-sided submodule has been placed. The double-sided submodule is formed of a carrier layer 2, which includes printed conductors 4 and, if so desired, passive component 7 on both sides. Each intermediate layer 3 includes two openings 6, into each of which a semiconductor chip 1 has been inserted. The drawing represents a particularly advantageous development when the semiconductor chips 1 are to be connected to one another. The shortest signal paths can be achieved when the semiconductor chips 1 are installed on the carrier layer 2 in a mirrored manner. In the openings on the right side of the figure, the semiconductor chips 1 are secured to the carrier layer 2 with their non-conductive rear sides with the aid of adhesive or glue 15 and are electrically connected through bonding wires 10 on printed conductors 4. The printed conductors 4, which have been placed on the carrier layer 2 in a mirrored manner, are connected to one another through the use of through-platings 16. In this way, it is possible to achieve extremely short signal transit times, which is advantageous above all at high frequencies. In the two openings 6 on the left, the semiconductor chips 1 are secured on the carrier layer 2 with the aid of flip-chip contacting 11 and are electrically connected to the printed conductors 4. A mirrored configuration is present herein as well. Very short signal transit times can be achieved through the use of through-platings 16. These are even shorter than when the semiconductor chips 1 are electrically contacted with the aid of bonding wires. The double-sided submodule includes a coverlayer 5 on each of the intermediate layers 3. That coverlayer projects beyond the intermediate layer 3 and the carrier layer 2 on the side opposite the external contacts 8. The intermediate layers 3, the carrier layer 2, and the coverlayer 5 are securely connected with the aid of lamination. The openings 6 in which the semiconductor chips 1 are located are sealed with molding compound 12. Furthermore, the semiconductor component includes a one-sided submodule, in which its carrier layer 2 is connected to one of the coverlayers 5 of the double-sided submodule. If the semiconductor chips of the one-sided submodule are to be connected to the semiconductor chip 1 or printed conductors 4 of the double-sided submodule, then contact interfaces 13, which are located both on the bottom side of the intermediate layer 2 and on the corresponding coverlayer 5, undertake the connection. The contact interfaces 13 are each connected to a through-plating 16. When two submodules are connected to each other, for instance with the aid of an anisotropic conductive adhesive or glue, then in addition to a secure connection of the two submodules, the electrical connection at the contact interfaces 13 is simultaneously guaranteed. However, it is also conceivable for solder balls or soldering pastes to be deposited at locations or points of the contact interfaces 13, in order to undertake the electrical connection. In the figure shown, two submodules are connected to each other. However, it is by all means conceivable that, starting with a double-sided submodule, an arbitrary number of one-sided submodules are placed on one another in order to so expand the component in the third dimension. The one-sided submodules can then also include additional contact interfaces 13 at the coverlayers 5. Those interfaces connect the semiconductor chips 1 of different submodules to one another. Since functionally different subassemblies are advantageously disposed in submodules, joining the submodules into a single semiconductor component represents a particularly space-efficient solution.

Figure 8:
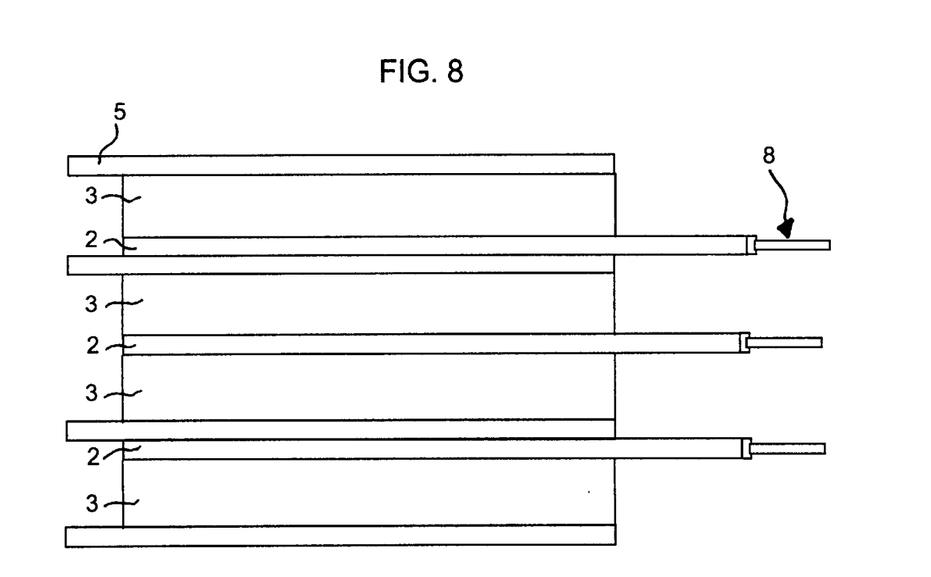
FIG. 8 is a cross-sectional view of a semiconductor component with a variation in component contacts.

FIG. 8 shows a cross-section of a semiconductor component formed of a double-sided submodule and two one-sided submodules. The one-sided submodules have been placed on the double-sided submodule symmetrically. The symmetry relates to the outer boundary of the housing, but not to the configuration of the semiconductor chips 1 and passive components 7, or printed conductors 4, respectively, in the interior of the submodules. The semiconductor component that is shown in FIG. 8 differs from the above-described variants in the construction of the external contacts 8. Instead of a plug connection with metallizations 9, the external contacts 8 are constructed as pins. However, other types of external contacts besides the variants shown in the exemplary embodiments are also conceivable.

The advantage of a semiconductor component according to the invention is that it can be composed of modularly constructed submodules. Each individual submodule, one-sided submodule or double-sided submodule, can be produced by using known manufacturing technologies. This allows a more cost-effective, rational and fast production of a submodule. New processing machines are not required in order to produce the individual subunits. Furthermore, the semiconductor component according to the invention has the advantage that the completely equipped and sealed modules experience less deformation than if the individual semiconductor subunits, semiconductor chips, passive components, and so on, had been placed on a subassembly carrier adjacent one another in an individual form. Due to the compact structure, an improved signal performance can be achieved, which is advantageous above all at higher frequencies. The semiconductor components have a small structural height and can be stacked and interconnected more easily due to the planar surfaces.

We claim:

1. A modularly expandable semiconductor component, comprising:
   at least one carrier layer, at least one intermediate layer and at least one coverlayer respectively disposed above one another;
   external contacts;
   a conductor configuration disposed on said at least one carrier layer and leading to said external contacts; and.
   at least one semiconductor chip inserted in said at least one intermediate layer and having contact pads connected to said conductor configuration;
   said at least one carrier layer and said at least one intermediate layer formed of an at least partly oxidized-through aluminum foil material having a metallic core.

2. The semiconductor component according to claim 1, including:
   a semiconductor component edge region;
   said at least one intermediate layer having at least one opening formed therein receiving said at least one semiconductor chip; and
   said conductor configuration terminating in a region near said at least one semiconductor chip in said semiconductor component edge region.

3. The semiconductor component according to claim 2, wherein said at least one coverlayer is a heat distributor.

4. The semiconductor component according to claim 1, wherein a respective intermediate layer is applied to at least one side of a carrier layer.

5. The semiconductor component according to claim 4, wherein a coverlayer is applied to one side of an intermediate layer and a carrier layer is applied to another side of said intermediate layer.

6. The semiconductor component according to claim 2, wherein said conductor configuration has conductors with ends disposed in the vicinity of said at least one semiconductor chip and within said at least one opening.

7. The semiconductor component according to claim 1, wherein said conductor configuration is disposed on at least one side of said at least one carrier layer.

8. The semiconductor component according to claim 1, wherein said at least one carrier layer has at least one passive component.

9. The semiconductor component according to claim 1, wherein said at least one coverlayer projects beyond said at least one intermediate layer and said at least one carrier layer on at least one side at which said external contacts are not disposed.

10. The semiconductor component according to claim 1, wherein said at least one carrier layer projects beyond said at least one intermediate layer and said at least one coverlayer on a side at which said external contacts are disposed.

11. The semiconductor component according to claim 1, wherein said conductor configuration has a common conductor supplying all of said at least one semiconductor chip.

12. The semiconductor component according to claim 1, wherein said external contacts for at least one carrier layer have a mechanical coding.

13. The semiconductor component according to claim 1, wherein said at least one carrier layer, said at least one intermediate layer, and said at least one coverlayer have through-platings.

14. The semiconductor component according to claim 13, wherein said contact pads of at least two semiconductor chips conduct a signal and are electrically interconnected by at least one of said conductor configuration and said through-platings.

15. The semiconductor component according to claim 13, wherein said at least one coverlayer and said at least one carrier layer have at least one contact interface, and said at least one contact interface is electrically connected to one of said conductor configuration and said through-platings.

16. The semiconductor component according to claim 1, wherein said at least one carrier layer has extended ends with said external contacts.

17. The semiconductor component according to claim 1, wherein said external contacts include metallizations on at least one side, and each of two metallizations conducts an electrical signal.

18. The semiconductor component according to claim 1, wherein said external contacts include metallizations on at least one side, and both metallizations conduct the same signal.

19. The semiconductor component according to claim 1, wherein said at least one carrier layer, said at least one intermediate layer and said at least one coverlayer are connected by anisotropic conductive adhesive.

20. A method for producing a semiconductor component, which comprises the following steps:
   a) equipping a carrier layer with at least one passive component and a conductor configuration having conductors with ends;
   b) connecting the carrier layer to an intermediate layer having at least one opening;
   c) inserting at least one semiconductor chip into the at least one opening;
   d) connecting the at least one semiconductor chip to the carrier layer;
   e) electrically contacting the at least one semiconductor chip with the conductors;
   f) applying and connecting a coverlayer covering the intermediate layer having the at least one opening;
   g) applying metallizations to the ends of the conductors; and
   h) forming the carrier layer and the intermediate layer of an at least partly oxidized-through aluminum foil material having a metallic core.

21. A method for producing a semiconductor component, which comprises the following steps:
   a) equipping a carrier layer with at least one passive component and a conductor configuration having conductors with ends;
   b) placing at least one semiconductor chip on the carrier layer;
   c) connecting the at least one semiconductor chip to the carrier layer;
   d) electrically contacting the at least one semiconductor chip with the conductors;
   e) applying and connecting the carrier layer to an intermediate layer having at least one opening;
   f) applying and connecting a coverlayer covering the intermediate layer having the at least one opening;
   g) applying metallizations to the ends of the conductors; and
   h) forming the carrier layer and the intermediate layer of an at least partly oxidized-through aluminum foil material having a metallic-core.

22. A method for producing a semiconductor component, which comprises:
   producing each of at least two submodules with the following steps:
      a) equipping a carrier layer with at least one passive component and a conductor configuration having conductors with ends;
      b) connecting one side of the carrier layer to an intermediate layer having at least one opening;
      c) inserting at least one semiconductor chip-into the at least one opening;
      d) connecting the at least one semiconductor chip to the carrier layer;
      e) electrically contacting the at least one semiconductor chip with the conductors;
      f) applying and connecting a coverlayer covering the intermediate layer having the at least one opening;
      g) applying metallizations to the ends of the conductors; and
      h) forming the carrier layer and the intermediate layer of an at least partly oxidized-through aluminum foil material having a metallic core;
   connecting another intermediate layer to the other side of the carrier layer; and
   joining the coverlayer of one submodule to the intermediate layer of another submodule.

23. A method for producing a semiconductor component, which comprises:
   producing each of at least two submodules with the following steps:
      a) equipping a carrier layer with at least one passive component and a conductor configuration having conductors with ends;
      b) placing at least one semiconductor chip on the carrier layer;
      c) connecting the at least one semiconductor chip to the carrier layer;
      d) electrically contacting the at least one semiconductor chip with the conductors;
      e) applying and connecting one side of the carrier layer to an intermediate layer having at least one opening;
      f) applying and connecting a coverlayer covering the intermediate layer having the at least one opening;
      g) applying metallizations to the ends of the conductors; and
      h) forming the carrier layer and the intermediate layer of an at least partly oxidized-through aluminum foil material having a metallic core;
   connecting another intermediate layer to the other side of the carrier layer; and
   joining the coverlayer of one submodule to the intermediate layer of another submodule.

* * * * *